United States Patent [19]

Hashimoto et al.

[11] Patent Number: 5,539,064
[45] Date of Patent: Jul. 23, 1996

[54] RESIST INK COMPOSITION, PRINTED CIRCUIT BOARD PRODUCED BY USING THE COMPOSITION AND PROCESS FOR PRODUCING THE PRINTED CIRCUIT BOARD

[75] Inventors: Soichi Hashimoto; Satoshi Miyayama; Toshiaki Nishimura; Toshikazu Oda, all of Kyoto, Japan

[73] Assignee: Goo Chemical Industries Co., Ltd., Kyoto, Japan

[21] Appl. No.: 526,983

[22] Filed: Sep. 12, 1995

[51] Int. Cl.[6] .............. C08F 283/00; C08J 3/28; G03C 1/725
[52] U.S. Cl. .......... 525/529; 525/107; 525/118; 525/119; 525/122; 525/187; 525/404; 525/407; 525/408; 525/524; 525/530; 525/531; 525/532; 522/100; 522/102; 522/103; 525/533; 430/280.1; 430/281.1; 430/285.1; 430/287.1; 430/288.1; 428/413; 428/500; 428/901
[58] Field of Search ............... 525/107, 118, 525/119, 122, 187, 404, 407, 408, 524, 529, 530, 531, 532, 533; 522/100, 102, 103; 430/280, 281, 285, 287, 288; 428/413, 500, 901

[56] References Cited

U.S. PATENT DOCUMENTS

| 4,076,765 | 2/1978 | Nakahara et al. | 525/530 |
|---|---|---|---|
| 4,722,947 | 2/1988 | Thanawalla et al. | 522/120 |
| 4,745,138 | 5/1988 | Thanawalla et al. | 522/120 |
| 4,845,012 | 7/1989 | Seko et al. | 522/86 |
| 4,855,215 | 8/1989 | Nakano et al. | 522/149 |
| 5,009,982 | 4/1991 | Kamayachi et al. | 430/280 |
| 5,124,234 | 6/1992 | Wakata et al. | 522/120 |
| 5,236,809 | 8/1993 | Onodera et al. | 430/283 |
| 5,344,747 | 9/1994 | Ohtawa et al. | 430/325 |
| 5,412,049 | 5/1995 | Argyropoulos et al. | 526/312 |

FOREIGN PATENT DOCUMENTS

| 56-40329 | 9/1981 | Japan . |
|---|---|---|
| 57-45785 | 9/1982 | Japan . |

Primary Examiner—John C. Bleutge
Assistant Examiner—Randy Gulakowski
Attorney, Agent, or Firm—Banner & Allegretti, Ltd.

[57] ABSTRACT

A resist ink composition developable with a diluted, alkaline solution, which exhibits high dispersion stability itself, can form a pattern with excellent resolution, even in the case of a low exposure amount, and can produce a cured resist film excellent in solvent resistance for high-performance printed circuits and which comprises an ultraviolet-curable resin obtained by copolymerizing (a) from 5 to 50% by weight of an ethylenically unsaturated monomer of a general formula:

$$CH_2=\underset{\underset{R_1}{|}}{C}-\underset{\underset{O}{\|}}{C}-O-(C_2H_4O)n-R_2$$

wherein $R_1$ represents a hydrogen atom or a methyl group; $R_2$ represents a hydrogen atom or an alkyl group; n represent an integer of from 1 to 4, and/or glycerol mono(meth)acrylate, (b) from 10 to 90% by weight or glycidyl (meth)acrylate and (c) from 0 to 80% by weight of other ethylenically unsaturated monomers capable of copolymerizing with these (a) and (b), followed by reacting the resulting copolymer with from 0.7 to 1.2 equivalents, relative to one epoxy equivalent of said copolymer, of (meth)acrylic acid and a saturated or unsaturated polybasic acid anhydride; a photopolymerization initiator; a diluent; and a thermosetting epoxy compound.

6 Claims, No Drawings

RESIST INK COMPOSITION, PRINTED CIRCUIT BOARD PRODUCED BY USING THE COMPOSITION AND PROCESS FOR PRODUCING THE PRINTED CIRCUIT BOARD

BACKGROUND OF THE INVENTION

The present invention relates to a photocurable and thermosetting resist ink composition, which is developable with a diluted, alkaline solution, to a cured resist film formed on the printed circuit board by using the composition, to a printed circuit board having thereon a solder resist produced by using the composition, and also to a process for producing the printed circuit board.

Recently, for the method of forming resist patterns for various printed circuit boards for consumer use and industrial use, a dry film or liquid developable resist ink having a high resolution and dimensional accuracy has come to be employed essentially, in place of screen printing systems, in order to meet the recent demand for printed wiring boards with high wiring densities.

Regarding this situation, disclosed in Japanese Patent Publication Nos. 56-40329/1981 and 57-45785/1982 is a resist ink composition consisting essentially of a reaction product to be obtained by reacting an epoxy resin with an unsaturated monocarboxylic acid followed by adding thereto a polybasic acid anhydride. In U.S. Pat. No. 5,009,982, disclosed is a photosensitive resin composition for a resist ink which is developable with a diluted alkali and which comprises a resin to be obtained by adding an acid anhydride to a novolak epoxy acrylate (this resin is soluble in a diluted, alkaline aqueous solution), a photopolymerization initiator, a diluent, and a thermosetting component comprising an epoxy compound. The composition comprising such an adduct composed of a novolak epoxy acrylate and a polybasic acid anhydride finally gives a relatively good cured resist film but is defective in that the epoxy acrylate-acid anhydride adduct does not always have sufficient photocurability at low exposure since the molecular weight of the raw material novolak epoxy resin available for industrial use is limited rather low.

In order to overcome this drawback, for example, considered may be the use of a carboxyl-containing polymer of ethylenic unsaturated monomers, such as (meth)acrylic or styrenic monomers, having a molecular weight of approximately from 10,000 to 200,000, as the polymer binder, while the photocurability of the composition is derived only from the diluent such as acrylic monomers. In such a resist ink composition, however, the polymer binder itself does not exhibit photocurability. Therefore, the composition still does not have sharp photocurability and often involves problems in that it is easily swollen or peeled during development with a diluted alkali.

When the resist ink composition is applied on a substrate with a spray coater, its viscosity must be lowered so as to make the coating operation easy. For this, in general, a large amount of a diluent is added to the composition thereby lowering its viscosity. If so, however, the components in the composition which are hardly soluble in the diluent added, such as pigments, epoxy resins, etc. often precipitate and separate out, and therefore the dispersion stability of the composition must be improved.

OBJECTS OF THE INVENTION

The object of the present invention is to provide a resist ink composition which is developable with a diluted alkali to give a pattern, even though it receives low-level exposure, and which has high dispersion stability itself and high resolution, and also to provide a cured resist film, excellent in solvent resistance, formed by using the composition, a printed circuit board produced by using the composition and a process for producing the printed circuit board by using the composition.

The above and other advantages of the invention will become more apparent in the following description.

DESCRIPTION OF THE INVENTION

The present invention provides a resist ink composition developable with a diluted, alkaline aqueous solution, which comprises:

(A) an ultraviolet-curable resin to be obtained by copolymerizing (a) from 5 to 50% by weight of an ethylenic unsaturated monomer of a general formula (I):

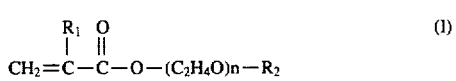

wherein $R_1$ represents a hydrogen atom or a methyl group; $R_2$ represents a hydrogen atom or an alkyl group; n represents an integer of from 1 to 4, and/or glycerol mono(meth)acrylate, (b) from 10 to 90% by weight of glycidyl (meth)acrylate and (c) from 0 to 80% by weight of other ethylenically unsaturated monomers capable of copolymerizing with these (a) and (b), followed by reacting the resulting copolymer with from 0.7 to 1.2 equivalents, relative to one epoxy equivalent of said copolymer, of (meth)acrylic acid and a saturated or unsaturated polybasic acid anhydride;

(B) a photopolymerization initiator;

(C) a diluent; and (D) a thermosetting epoxy compound.

In the preceding and following description, all "(meth)acryl" represents "acryl" and/or "methacryl". Thus, for example, (meth)acrylate represents acrylate and/or methacrylate.

PREFERRED EMBODIMENTS OF THE INVENTION

Ultraviolet-curable resin (A):

The ultraviolet-curable resin (A) for use in the present invention is obtained by copolymerizing (a) an ethylenically unsaturated monomer of formula (I) and/or glycerol mono(meth)acrylate, (b) glycidyl (meth)acrylate and optionally (c) other ethylenically unsaturated monomers capable of copolymerizing with these (a) and (b), followed by reacting the resulting copolymer with (meth)acrylic acid and a saturated or unsaturated polybasic acid anhydride.

The above-mentioned copolymer is obtained by conventional polymerization methods, for example, by solution polymerization, emulsion polymerization, etc.

One example for preparing the copolymer by solution polymerization is referred to hereinunder. A mixture of unsaturated monomers comprising the above-mentioned components (a) and (b) and optionally component (c) is stirred under heat in a suitable organic solvent in a nitrogen stream, while adding thereto a polymerization initiator, and the monomers are polymerized to obtain the intended copolymer.

As the organic solvent, for example, usable are any of linear or branched, secondary or polyhydric alcohols such as ethanol, propanol, isopropanol, butanol, isobutanol, 2-butanol, hexanol, ethylene glycol, etc.; ketones such as methyl ethyl ketone, cyclohexanone, etc.; aromatic hydrocarbons such as toluene, xylene, etc.; cellosolves such as cellosolve, butylcellosolve, etc.; carbitols such as carbitol, butylcarbitol, etc.; propylene glycol alkyl ethers such as propylene glycol methyl ether, etc.; polypropylene glycol alkyl ethers such as dipropylene glycol methyl ether, etc.; acetates such as ethyl acetate, butyl acetate, cellosolve acetate, butylcellosolve acetate, butylcarbitol acetate, propylene glycol monomethyl ether acetate, etc.; lactates such as ethyl lactate, butyl lactate, etc.; dialkyl glycol ethers, etc. These organic solvents are used singly or as their mixtures.

As the polymerization initiator, for example, usable are any of peroxides such as benzoyl peroxide, etc.; azo compounds such as azobisisobutyronitrile, etc.

The ethylenically unsaturated monomer of formula (I) to be in the component (a) includes, for example, hydroxyethyl (meth)acrylate; alkoxyethyl (meth)acrylates such as methoxyethyl (meth)acrylate, ethoxyethyl (meth)acrylate, etc.; polyethylene glycol mono(meth)acrylates such as diethylene glycol mono(meth)acrylate, triethylene glycol mono(meth)acrylate, tetraethylene glycol mono(meth)acrylate, etc.; alkoxypolyethylene glycol (meth)acrylates such as methoxydiethylene glycol (meth)acrylate, methoxytriethylene glycol (meth)acrylate, methoxytetraethylene glycol (meth)acrylate, etc. These ethylenically unsaturated monomers and glycerol mono(meth)acrylate are used singly or as their combinations.

It is desired that the amount of above-mentioned component (a) to be copolymerized is from 5 to 50% by weight relative to the total amount of the unsaturated monomers to be copolymerized to form the copolymer, in order that the constitutive components of the resist ink composition of the present invention are prevented from being precipitated and that said components have improved dispersion stability. If the amount of the component (a) is more than 50% by weight, the cured resist film formed by the resist ink composition will have poor solvent resistance and hydrolytic stability.

Compounds of formula (I) in which the terminal $R_2$ forms a hydroxyl group as well as glycerol mono(meth)acrylate are preferably employed as the component (a), when it is desired to add large amount of polybasic anhydride to the above-mentioned copolymer. The reason is that in the absence of these hydroxyl group containing compounds as the component (a), the amount of polybasic anhydride to be introduced to the above-mentioned copolymer is limited within the equivalent range of glycidyl groups, and hydroxyl groups coming from the reaction of glycidyl group with (meth)acrylate, which exist in the said copolymer. On the other hand, when the above-mentioned hydroxyl group containing compounds are employed as the component (a), the amount polybasic anhydride is not to be restricted by the equivalent range of glycidyl groups, and hydroxyl groups coming from the reaction of glycidyl group with (meth)acrylate, so that the amount of the ultraviolet-reactive unsaturated groups coming from the (meth)acrylate and the amount of the carboxylic groups coming from the polybasic anhydride which are added to the ultraviolet-curable resin of the present invention, will be able to independent each other. Accordingly, the photocurability and developability or resolution of said composition will be able to become well balanced.

The above-mentioned component (b) of glycidyl (meth)acrylate is employed as a comonomer to introduce glycidyl groups to said copolymer and thereafter thus glycidyl groups will be reacted with (meth)acrylic acid, so that unsaturated double bonds, which give said copolymer photocurability through ultraviolet radiation, will be introduced to said copolymer. Therefore, it is desired that the amount of glycidyl (meth)acrylate to be copolymerized is from 10 to 90% by weight relative to the total amount of the unsaturated monomers to be copolymerized to form the copolymer, in order that the ultraviolet-curable resin may have sufficient photocurability. If the amount of the glycidyl (meth)acrylate to be copolymerized is less than 10% by weight, there is a probability that the photocurability of the ultraviolet-curable resin is insufficient.

The above-mentioned component (c) may be any of ethylenically unsaturated monomers that are copolymerizable with the above-mentioned components (a) and (b). It includes, for example, linear, branched or alicyclicalkyl (meth)acrylates such as methyl (meth)acrylate, ethyl (meth)acrylate, propyl (meth)acrylate, butyl (meth)acrylate, isobutyl (meth)acrylate, tert-butyl (meth)acrylate, 2-ethylhexyl (meth)acrylate, n-octyl (meth)acrylate, n-decyl (meth)acrylate, isodecyl (meth)acrylate, lauryl (meth)acrylate, myristyl (meth)acrylate, cetyl (meth)acrylate, stearyl (meth)acrylate, cyclohexyl (meth)acrylate, etc.; other (meth)acrylates such as benzyl (meth)acrylate, hydroxypropyl (meth)acrylate, hydroxybutyl (meth)acrylate, etc.; (meth)acrylamide compounds such as (meth)acrylamide, N-methyl(meth)acrylamide, N-propyl(meth)acrylamide, N-tert-butyl(meth)acrylamide, N-tert-octyl (meth)acrylamide, diacetone (meth)acrylamide, etc.; quaternary salts of cationic monomers such as dimethylaminopropyl (meth)acrylate, dimethylaminobutyl (meth)acrylate, diethylaminoethyl (meth)acrylate, etc.; as well as vinyl pyrrolidone, acrylonitrile, vinyl acetate, styrene, etc. These are used singly or as their combinations.

These are optionally added to the comonomers, by which the solubility of the ultraviolet-curable resin in solvents is controlled and the hardness and the strength of the pre-cured or cured resist film formed by the resist ink composition of the present invention are enhanced or controlled.

It is desired that the amount of the (meth)acrylic acid to be added to the above-mentioned copolymer is from 0.7 to 1.2 equivalents, relative to the content of the glycidyl (meth)acrylate in the copolymer. If the amount of said acid is less than 0.7 equivalents, too many glycidyl groups remain in the ultraviolet-curable resin, by which the developability of the pre-cured resist film after exposed is often lowered. If, on the other hand, it is more than 1.2 equivalents, non-reacted (meth)acrylic acid unfavorably remains in the resin.

As examples of the saturated or unsaturated polybasic acid anhydride to be reacted with the copolymer, mentioned are dibasic acid anhydrides such as succinic anhydride, methylsuccinic anhydride, maleic anhydride, citraconic anhydride, glutaric anhydride, itaconic anhydride, phthalic anhydride, tetrahydrophthalic anhydride, methyltetrahydrophthalic anhydride, methylnadic anhydride, hexahydrophthalic anhydride, methylhexahydrophthalic anhydride, etc.; tribasic or higher polybasic acid anhydrides such as trimellitic acid anhydride, pyromellitic acid anhydride, benzophenone-tetracarboxylic acid anhydride, methylcyclohexene-tetracarboxylic acid anhydride, etc. It is preferred that the saturated or unsaturated polybasic acid anhydride is added to the above-mentioned copolymer in an amount of from 0.05 to 1.0 equivalent, more preferably from 0.15 to 1.0 equivalent, relative to the total of the hydroxyl groups and the amino groups existing in said copolymer.

The addition of (meth)acrylic acid and the above-mentioned saturated or unsaturated polybasic acid anhydride to the copolymer may be conducted by any known method. For instance, (meth)acrylic acid is added to a solution of the above-mentioned copolymer dissolved in a solvent and reacted with said copolymer, in accordance with a conventional method in the presence of a thermal polymerization inhibitor, such as hydroquinone, hydroquinone monomethyl ether or the like, and a catalyst selected from, for example, tertiary amines such as benzyldimethylamine, triethylamine, etc., quaternary ammonium salts such as trimethylbenzylammonium chloride, methyltriethylammonium chloride, etc., and triphenylstibine, preferably at 60° to 150° C., more preferably at 80° to 120° C. The addition of the saturated or unsaturated polybasic acid anhydride to the copolymer may also be effected in the same manner as above.

It is desired that the ultraviolet-curable resin has a molecular weight of from 4,000 to 200,000, in view of the photocurability, the developability, the hardenability, the coatability and the dispersion stability of the resist ink composition containing said resin. It is desired that the amount of said resin in the resist ink composition is from 2 to 60% by weight relative to the total weight of the composition.

Photopolymerization initiator (B):

The photopolymerization initiator for use in the present invention includes, for example, benzoin and its alkyl ethers such as benzoin, benzoin methyl ether, benzoin ethyl ether, benzoin isopropyl ether, etc.; acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-[4-(methylthio)phenyl]-2-morpholino-propan-1-one, etc.; anthraquinones such as 2-methylanthraquinone, 2-amylanthraquinone, etc.; thioxanthones such as 2,4-dimethylthioxanthone, 2,4-diethylthioxanthone, 2-chlorothioxanthone, 2,4-diisopropylthioxanthone, etc.; ketals such as acetophenone dimethylketal, benzyldimethylketal, etc. benzophenones or xanthones such as benzophenone; as well as "Lucirin TPO" (2,4,6-trimethylbenzoyldiphenylphosphine oxide, produced by BASF), etc. These may be combined with known photopolymerization promoters such as benzoic acid compounds, tertiary amines, etc. These photopolymerization initiators may be added singly or as a combination of two or more of these, to the resist ink composition, preferably in an amount of from 0.1 to 30% by weight, more preferably from 0.5 to 25% by weight, relative to the amount of the ultraviolet-curable component in the composition.

Diluent (C):

As the diluent (C), usable are any of photopolymerizable monomers and organic solvents, singly or as a combination of these.

As examples of photopolymerizable monomers which are usable in the present invention, mentioned are water-soluble monomers such as 2-hydroxyethyl (meth)acrylate, 2-hydroxypropyl (meth)acrylate, N-vinylpyrrolidone, (meth)acryloylmorpholine, methoxytetraethylene glycol (meth)acrylate, methoxypolyethylene glycol (meth)acrylate, polyethylene glycol di(meth)acrylate, N,N-dimethyl-(meth)acrylamide, N-methylol (meth)acrylamide, N,N-dimethylaminopropyl (meth)acrylamide, N,N-dimethylaminoethyl (meth)acrylate, N,N-dimethylaminopropyl (meth)acrylate, melamine (meth)acrylate, etc.; water-insoluble monomers such as diethylene glycol di(meth)acrylate, triethylene glycol di(meth)acrylate, propylene glycol di(meth)acrylate, tripropylene glycol di(meth)acrylate, phenoxyethyl (meth)acrylate, tetrahydrofurfuryl (meth)acrylate, cyclohexyl (meth)acrylate, trimethylolpropane di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerithritol hexa(meth)acrylate, isobornyl (meth)acrylate, cyclopentaenyl (mono or di)(meth)acrylate, cyclopentenyl (mono or di)(meth)acrylate, mono-, di-, tri- or higher polyesters of polybasic acids and hydroxyalkyl (meth)acrylates, etc.; epoxy acrylates such as hisphenol-A-type epoxy acrylates, phenol-novolak-type epoxy acrylates, cresol-novolak-type epoxy acrylates, etc. (these epoxy acrylates may be partially crosslinked with compounds having at least two isocyanato groups in the molecule or with polybasic acid anhydrides, etc.); high-molecular acrylate monomers such as polyester acrylates, urethane acrylates, etc. These water-soluble monomers, water-insoluble monomers and high-molecular acrylate monomers can be used singly or as a combination comprising any of these.

As examples of organic solvents which are usable in the present invention, mentioned are linear or branched, secondary or polyhydric alcohols such as ethanol, propanol, isopropanol, butanol, isobutanol, 2-butanol, hexanol, ethylene glycol, etc.; ketones such as methyl ethyl ketone, cyclohexanone, etc.; aromatic hydrocarbons such as toluene, xylene, etc.; cellosolves such as cellosolve, butylcellosolve, etc.; carbitols such as carbitol, butylcarbitol, etc.; propylene glycol alkyl ethers such as propylene glycol methyl ether, etc.; polypropylene glycol alkyl ethers such as dipropylene glycol methyl ether, etc.; acetates such as ethyl acetate, butyl acetate, cellosolve acetate, butylcellosolve acetate, butylcarbitol acetate, propylene glycol monomethyl ether acetate, etc.; dialkyl glycol ethers, etc.

The above-mentioned photopolymerizable monomers such as water-soluble monomers, water-insoluble monomers and high-molecular acrylate monomers act to dilute the polymer component and others in the resist ink composition of the present invention to thereby make the composition easily coatable on a substrate, while controlling the acid value of the composition to make it photopolymerizable. The above-mentioned organic solvents act to dissolve and dilute the polymer component and the other components in the composition to thereby make the composition liquid and coatable on a substrate, while making the composition into in film when dried. It is preferred that the above-mentioned diluent is incorporated, singly or as a mixture of two or more of them, into the resist ink composition in an amount of from 10 to 95% by weight relative to the total amount of the composition, depending on the coating method.

Thermosetting epoxy compound (D):

As examples of the thermosetting epoxy compound for use in the present invention, mentioned are bisphenol A-type epoxy resins, bisphenol-F-type epoxy resins, phenol-novolak-type epoxy resins, cresol-novolak-type epoxy resins, N-glycidyl-type epoxy resins or alicyclic epoxy resins (e.g., "EHPE-3150", produced by Daisel Chemical Industries), "YX-4000" (epoxy resin, produced by Yuka Shell Epoxy Co.), hydrogenated hisphenol-A-type epoxy resins, triglycidyl isocyanurate, etc. Of these, especially preferred are triglycidyl isocyanurate, "YX-4000", cresol-novolak-type epoxy resins, etc.

The resist ink composition of the present invention may contain, in addition to the above-mentioned polymer component, other polymer compounds, for example, ultraviolet-curable epoxy acrylates (e.g., adducts to be prepared by adding (meth)acrylic acid to bisphenol-A-type, phenol-novolak-type, cresol-novolak-type or alicyclic epoxy resins); adducts of said ultraviolet-curable epoxy acrylates to be prepared by adding thereto saturated or unsaturated polybasic acid anhydrides such as maleic anhydride, succinic anhydride, iraconic anhydride, phthalic anhydride, tetrahydrophthalic anhydride, etc.; copolymers of ethylenically unsaturated compounds, such as styrene-(meth)acrylic acid-(meth)acrylate copolymers, etc.; ultraviolet-curable polymers to be obtained by reacting said copolymers of ethylenically unsaturated compounds with epoxy-having, ethylenically unsaturated monomers; as well as melamine resins, urethane resins, etc.

In addition, the resist ink composition of the present invention may contain, if desired, various additives, for example, epoxy-resin curing agents and curing accelerators such as imidazole derivatives, polyamines, guanamines, tertiary amines, quaternary ammonium salts, polyphenols, polybasic acid anhydrides, etc.; fillers such as barium sulfate, silicon oxide, talc, clay, calcium carbonate, etc.; colorants; defoaming agents; adhesion directors such as silane coupling agents, etc.; leveling agents; anti-halation agents; and also polymerization inhibitors such as hydroquinone, hydroquinone monomethyl ether, pyrogallol, tert-butyl catechol, phenothiazine, etc.; surfactants and polymer dispersing agents for improving the dispersion stability of the composition, etc.

The resist ink composition of the present invention is prepared by kneading the above-mentioned components and optionally additives, etc., for example, in a three-roll mill, a ball mill, a sand mill, etc. If desired, it is possible to previously mix and disperse some of the above-mentioned components (A) to (D), for example, the components (A) and (C), and the remaining components may be added to the thus-prepared dispersion to give the final resist ink composition of the present invention just before its use.

Of course, the resist ink composition of the present invention is useful as a solder resist ink, but, if the final curing process is not employed, it is also available as an etching resist ink for printed circuit board. Not to mention, another composition comprising all the components except (D) of the resist ink composition of the present invention is also useful as an etching resist ink for printed circuit board.

The resist ink composition of the present invention can also be used for forming color filter-protecting films. When a colorant selected from pigments and dyes is added to the resist ink composition of the present invention, while said colorant is suitably selected from organic dyes such as azo lake dyes insoluble azo dyes phthalocyanine dyes, etc., or from inorganic dyes such as Hillon Blue, iron oxide, cobalt pigments, etc., or from oil-soluble dyes, basic dyes, disperse dyes, etc., the resist ink composition can be used for forming color filter pixels.

Examples of the present invention are described hereinunder, which, however, are not intended to restrict the scope of the present invention. In the following examples, all "parts" and "%" are by weight. First, production examples are given to demonstrate the production of ultraviolet-curable resins which are used in the examples following them.

[Production Example 1]

10 parts of glycidyl methacrylate, 20 parts of methoxyethyl acrylate, 50 parts of styrene, 20 parts of methyl methacrylate, 100 parts of carbitol acetate and 3 parts of benzoyl peroxide were put into a four-neck flask equipped with a reflux condenser, a thermometer, a dropping funnel, a glass tube for substitution with nitrogen and a stirrer, and polymerized under heat at 75° C. for 5 hours in a nitrogen stream, to obtain a 50% solution of a copolymer.

To this 50% copolymer solution added were 0.05 parts of hydroquinone, 5.3 parts of acrylic acid and 0.2 parts of dimethylbenzylamine and subjected to an addition reaction at 100° C. for 24 hours. Subsequently, 10.7 parts of tetrahydrophthalic anhydride and 16 parts of carbitol acetate were added thereto and reacted at 100° C. for 3 hours, to obtain an ultraviolet-curable resin (A-1) having a mean molecular weight of about 35,000.

[Production Example 2]

30 parts of glycidyl methacrylate, 40 parts of hydroxyethyl methacrylate, 30 parts of methyl methacrylate, 100 parts of cellosolve acetate and 2.0 parts of azobisisobutyronitrile were put into a four-neck flask equipped with a reflux condenser, a thermometer, a dropping funnel, a glass tube for substitution with nitrogen and a stirrer, and polymerized under heat at 75° for 5 hours in a nitrogen stream, to obtain a 50% solution of a copolymer.

To this 50% copolymer solution added were 0.05 parts of hydroquinone, 15.9 parts of acrylic acid and 0.2 parts of dimethylbenzylamine and subjected to an addition reaction at 100° C. for 24 hours. Subsequently, 45 parts of tetrahydrophthalic anhydride and 61 parts of carbitol acetate were added thereto and reacted at 100° C. for 3 hours, to obtain an ultraviolet-curable resin (A-2) having a mean molecular weight of about 70,000.

In preparing this ultraviolet-curable resin, the amount of the tetrahydrophthalic anhydride added, namely 0.3 mols, was sufficiently larger than the amount of the hydroxyl groups derived from the ring cleavage of the glycidyl methacrylate of being 0.21 equivalents. Accordingly, the resin thus prepared had sufficient solubility in diluted alkalis.

[Production Example 3]

60 parts of glycidyl methacrylate, 20 parts of methoxydiethylene glycol acrylate, 20 parts of tert-butyl methacrylate, 100 parts of cyclohexanone and 1 part of azobisisobutyronitrile were put into a four-neck flask equipped with a reflux condenser, a thermometer, a dropping funnel, a glass tube for substitution with nitrogen and a stirrer, and polymerized under heat at 75° C. for 5 hours in a nitrogen stream, to obtain a 50% solution of a copolymer.

To this 50% copolymer solution were added 0.05 parts of hydroquinone, 32 parts of acrylic acid and 0.2 parts of dimethylbenzylamine and subjected to an addition reaction at 100° C. for 24 hours. Subsequently, 10.7 parts of tetrahydrophthalic anhydride and 43 parts of carbitol acetate were added thereto and reacted at 100° C. for 3 hours, to obtain an ultraviolet-curable resin (A-3) having a mean molecular weight of about 120,000.

[Production Example 4]

30 parts of glycidyl methacrylate, 20 parts of methoxyethyl acrylate, 40 parts of styrene, 10 parts of α-methylstyrene, 100 parts of carbitol acetate and 3 parts of benzoyl peroxide were put into a four-neck flask equipped with a reflux condenser, a thermometer, a dropping funnel, a glass tube for substitution with nitrogen and a stirrer, and polymerized under heat at 75° C. for 5 hours in a nitrogen stream, to obtain a 50% solution of a copolymer.

To this 50% copolymer solution added were 0.05 parts of hydroquinone, 15.9 parts of acrylic acid and 0.2 parts of dimethylbenzylamine and subjected to an addition reaction at 100° C. for 24 hours. Subsequently, 25.7 parts of tetrahydrophthalic anhydride and 42 parts of carbitol acetate were added thereto and reacted at 100° C. for 3 hours, to obtain an ultraviolet-curable resin (A-4) having a mean molecular weight of about 25,000.

[Production Example 5]

10 parts of glycidyl methacrylate, 30 parts of glycerol methacrylate, 40 parts of methyl methacrylate, 20 parts of tert-butyl methacrylate, 100 parts of carbitol acetate and 3 parts of benzoyl peroxide were put into a four-neck flask equipped with a reflux condenser, a thermometer, a dropping funnel, a glass tube for substitution with nitrogen and a stirrer, and polymerized under heat at 75° C. for 5 hours in a nitrogen stream, to obtain a 50% solution of a copolymer.

To this 50% copolymer solution added were 0.05 parts of hydroquinone, 5.2 parts of acrylic acid and 0.2 parts of dimethylbenzylamine and subjected to an addition reaction at 100° C. for 24 hours. Subsequently, 30 parts of tetrahydrophthalic anhydride and 35 parts of carbitol acetate were added thereto and reacted at 100° C. for 3 hours, to obtain an ultraviolet-curable resin (A-5) having a mean molecular weight of about 25,000.

In preparing this ultraviolet-curable resin, the amount of the tetrahydrophthalic anhydride added, namely 0.2 mols, was sufficiently larger than the amount of the hydroxyl groups derived from the ring cleavage of the glycidyl methacrylate of 0.07 equivalents. Accordingly, the resin thus prepared had sufficient solubility in diluted alkalis.

[Example 1]

| [Formulation of Components] | |
|---|---|
| Ultraviolet-curable resin (A-1) | 60 parts |
| Dipentaerythritol hexaacrylate | 5 parts |
| TEPIC (epoxy resin having an epoxy equivalent of 100, produced by Nissan Chemical Co.) | 10 parts |
| Irgacure 907 (photopolymerization initiator, produced by Ciba-Geigy Co.) | 3 parts |
| Cantacure ITX (photopolymerization initiator, produced by Shell Chemical Co.) | 0.5 parts |
| Modaflow (leveling agent, produced by Monsanto Co.) | 1 part |
| Silica (mean particle size: 1 μm) | 14 parts |
| Phthalocyanine Green | 0.5 parts |
| Butyl cellosolve | 5 parts |
| Melamine | 1 part |
| Total | 100 parts |

The components of the above table were mixed together to form a homogenous paste, which was then grounded using three-roll mill to produce a resist ink composition.

The composition was applied by screen printing to a printed circuit board substrate composed of glass fiber reinforced epoxy resin coppercrad laminate, thickness of the crad was 35 μm, having a printed circuit relief pattern on the surface.

Then the substrate having the resist composition layer on it, was heated at 80° C. for 20 minutes to remove the volatile solvent, the above treatment being called as a pre-cure process. After the pre-cure process as mentioned above, the thickness of the pre-cured resist film on the substrate was achieved to 20 μm.

Using a photo-tool artwork, the coated surface of the substrate was selectively exposed for 150 mj to ultraviolet light. After the exposure, the photo-tool artwork was removed, and the pre-cured resist film on the substrate was developed by spraying with a 1% aqueous solution of sodium carbonate so that the unexposed areas of the pre-cured resist film was removed.

Next, the printed circuit board substrate with developed pre-cure resist film on it was heated at 150° C. for 30 minutes to cure the film completely. Thus, specimens were prepared.

The thus-prepared test specimens had a pattern of high resolution and exhibited excellent solvent resistance. 100 parts of cellosolve acetate were added to the above-mentioned resist ink composition to dilute it. The thus-diluted resist ink was allowed to stand at 40° C. for 24 hours, resulting in that no precipitate was formed.

[Example 2]

| [Formulation of Components] | |
|---|---|
| Ultraviolet-curable resin (A-2) | 40 parts |
| Dipentaerythritol hexaacrylate | 10 parts |
| TEPIC (epoxy resin having an epoxy equivalent of 100, produced by Nissan Chemical Co.) | 10 parts |
| Irgacure 907 (photopolymerization initiator, produced by Ciba-Geigy Co.) | 3 parts |
| Cantacure ITX (photopolymerization initiator, produced by Shell Chemical Co.) | 0.5 parts |
| Modaflow (leveling agent, produced by Monsanto Co.) | 1 part |
| Silica (mean particle size: 1 μm) | 14 parts |
| Barium sulfate | 15 parts |
| Phthalocyanine Green | 0.5 parts |
| Cellosolve acetate | 5 parts |
| Melamine | 1 part |
| Total | 100 parts |

From the above-mentioned components, specimens were prepared in the same manner as in Example 1.

The thus-prepared specimens had a pattern of high resolution and exhibited excellent solvent resistance. 100 parts of cellosolve acetate were added to the above-mentioned resist ink composition to dilute it. The thus-diluted resist ink was allowed to stand at 40° C. for 24 hours, resulting in that no precipitate was formed.

[Example 3]

| [Formulation of Components] | |
|---|---|
| Ultraviolet-curable resin (A-3) | 40 parts |
| Dipentaerythritol hexaacrylate | 10 parts |
| YX-4000 (epoxy resin having an epoxy equivalent of 177, produced by Yuka Shell Chemical Co.) | 10 parts |
| Irgacure 907 (photopolymerization initiator, produced by Ciba-Geigy Co.) | 3 parts |
| Cantacure ITX (photopolymerization initiator, produced by Shell Chemical Co.) | 0.5 parts |
| Modaflow (leveling agent, produced by Monsanto Co.) | 1 part |
| Silica (mean particle size: 1 μm) | 14 parts |
| Barium sulfate | 15 parts |
| Phthalocyanine Green | 0.5 parts |
| Butyl cellosolve | 5 parts |
| Melamine | 1 part |
| Total | 100 parts |

From the above-mentioned components, specimens were were prepared in the same manner as in Example 1.

The thus-prepared specimens had a pattern of high resolution and exhibited excellent solvent resistance. 100 parts of cellosolve acetate were added to the above-mentioned resist ink composition to dilute it. The thus-diluted resist ink was allowed to stand at 40° C. for 24 hours, resulting in that no precipitate was formed.

11

[Example 4]

| [Formulation of Components] | |
|---|---|
| Ultraviolet-curable resin (A-4) | 65 parts |
| Dipentaerythritol hexaacrylate | 5 parts |
| TEPIC (epoxy resin having an epoxy equivalent of 100, produced by Nissan Chemical Co.) | 10 parts |
| Irgacure 907 (photopolymerization initiator, produced by Ciba-Geigy Co.) | 3 parts |
| Cantacure ITX (photopolymerization initiator, produced by Shell Chemical Co.) | 0.5 parts |
| Modaflow (leveling agent, produced by Monsanto Co.) | 1 part |
| Silica (mean particle size: 1 μm) | 14 parts |
| Phthalocyanine Green | 0.5 parts |
| Melamine | 1 part |
| Total | 100 parts |

From the above-mentioned components, specimens were prepared in the same manner as in Example 1.

The thus-prepared test pieces had a pattern of high resolution and exhibited excellent solvent resistance. 100 parts of cellosolve acetate were added to the above-mentioned resist ink composition to dilute it. The thus-diluted resist ink was allowed to stand at 40° C. for 24 hours, resulting in that no precipitate was formed.

[Example 5]

| [Formulation of Components] | |
|---|---|
| Ultraviolet-curable resin (A-5) | 65 parts |
| Dipentaerythritol hexaacrylate | 5 parts |
| TEPIC (epoxy resin having an epoxy equivalent of 100, produced by Nissan Chemical Co.) | 10 parts |
| Irgacure 907 (photopolymerization initiator, produced by Ciba-Geigy Co.) | 3 parts |
| Cantacure ITX (photopolymerization initiator, produced by Shell Chemical Co.) | 0.5 parts |
| Modaflow (leveling agent, produced by Monsanto Co.) | 1 part |
| Silica (mean particle size: 1 μm) | 14 parts |
| Phthalocyanine Green | 0.5 parts |
| Melamine | 1 part |
| Total | 100 parts |

From the above-mentioned components, specimens were prepared in the same manner as in Example 1.

The thus-prepared test pieces had a pattern of high resolution and exhibited excellent solvent resistance. 100 parts of cellosolve acetate were added to the above-mentioned resist ink composition to dilute it. The thus-diluted resist ink was allowed to stand at 40° C. for 24 hours, resulting in that no precipitate was formed.

12

What is claimed is:

1. A resist ink composition developable with a diluted, alkaline aqueous solution, which comprises:

(A) an ultraviolet-curable resin to be obtained by copolymerizing (a) from 5 to 50% by weight of an ethylenically unsaturated monomer of a general formula (I):

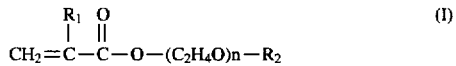

wherein $R_1$ represents a hydrogen atom or a methyl group; $R_2$ represents a hydrogen atom or an alkyl group; n represents an integer of from 1 to 4, and/or glycerol mono(meth)acrylate, (b) from 10 to 90% by weight of glycidyl (meth)acrylate and (c) from 0 to 80% by weight of other ethylenically unsaturated monomers capable of copolymerizing with these (a) and (b), followed by reacting the resulting copolymer with from 0.7 to 1.2 equivalents, relative to one epoxy equivalent of said copolymer, of (meth)acrylic acid and a saturated or unsaturated polybasic acid anhydride;

(B) a photopolymerization initiator;

(C) a diluent; and (D) a thermosetting epoxy compound.

2. A resist ink composition according to claim 1, in the form of a solder resist ink composition.

3. A cured resist film on a substrate formed by using the resist ink composition according to claim 1.

4. A printed circuit board including the resist ink composition according to claim 2.

5. A process for producing a printed circuit board with the cured solder resist on the surface, by using the solder resist ink composition according to claim 2.

6. A process for producing a printed circuit board comprising the steps of:

(a) applying the resist ink composition of claim 2 to a surface of the printed circuit board substrate to form a resist ink composition layer;

(b) pre-curing the resist ink composition layer on the substrate to generate pre-cured resist film;

(c) selectively exposing the pre-cured resist film on the substrate to ultraviolet light by using a photo-tool artwork;

(d) developing the exposed pre-cured resist film on the substrate with an aqueous solution to remove the unexposed areas of the film; and (e) curing the developed pre-cured resist film pattern on the substrate.

* * * * *